United States Patent
Fujita et al.

(10) Patent No.: US 9,171,618 B2
(45) Date of Patent: Oct. 27, 2015

(54) SEMICONDUCTOR INTEGRATED CIRCUIT AND PROCESSOR

(75) Inventors: Shinobu Fujita, Inagi (JP); Keiko Abe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 531 days.

(21) Appl. No.: 13/556,431

(22) Filed: Jul. 24, 2012

(65) Prior Publication Data

US 2013/0028012 A1  Jan. 31, 2013

(30) Foreign Application Priority Data

Jul. 28, 2011 (JP) ................................ 2011-166070

(51) Int. Cl.
    *G11C 11/00* (2006.01)
    *G11C 14/00* (2006.01)
(52) U.S. Cl.
    CPC ........ *G11C 14/0054* (2013.01); *G11C 14/0081* (2013.01)
(58) Field of Classification Search
    CPC .................. G11C 14/0054; G11C 14/0081
    USPC ............. 365/158, 154, 148, 209, 189.07, 171
    See application file for complete search history.

(56) References Cited

U.S. PATENT DOCUMENTS

| 7,760,538 | B1 | 7/2010 | Paak |
| 2008/0225590 | A1 | 9/2008 | Lamorey |
| 2008/0229269 | A1* | 9/2008 | Lamorey .................. 716/12 |
| 2010/0080042 | A1 | 4/2010 | Lamorey |
| 2011/0216573 | A1 | 9/2011 | Abe et al. |
| 2011/0273925 | A1* | 11/2011 | Yamamoto et al. ........... 365/154 |

FOREIGN PATENT DOCUMENTS

| CN | 101636791 A | 1/2010 |
| CN | 101821810 A | 9/2010 |
| JP | 2007-52879 | 3/2007 |
| WO | WO 2009028298 A1 * | 3/2009 ............ G11C 14/00 |

OTHER PUBLICATIONS

Yamamoto, S. et al., "Nonvolatile Static Random Access Memory Using Magnetic Tunnel Junctions with Current-Induced Magnetization Switching Architecture," Japanese Journal of Applied Physics, 48, pp. 043001-1 to 043001-7, (2009).
Notification of the First Office Action issued by the State Intellectual Property Office of the People's Republic of China on Dec. 26, 2014, for Chinese Patent Application No. 201210141293.6, and English-language translation thereof.
Notification of the Second Office Action issued by the State Intellectual Property Office of the People's Republic of China on Aug. 17, 2015, for Chinese Patent Application No. 201210141293.6, and English-language translation thereof.

* cited by examiner

*Primary Examiner* — Richard Elms
*Assistant Examiner* — Mohammed A Bashar
(74) *Attorney, Agent, or Firm* — Finnegan, Henderson, Farabow, Garrett & Dunner, L.L.P.

(57) ABSTRACT

In one embodiment, there is provided a semiconductor integrated circuit that includes: a first inverter; a second inverter; a first transistor, wherein one end of the first transistor is connected to a first bit line and the other end of the first transistor is connected to a first input terminal of the first inverter; a first element group including second transistors, wherein one end of the first element group is connected to a first output terminal of the first inverter and the other end of the first element group is connected to a second bit line; and a second element group including third transistors and a magnetoresistive element whose magnetic resistance is varied. The second element group is disposed between the second output terminal of the second inverter and a first terminal or disposed between the first transistor and the first terminal.

10 Claims, 14 Drawing Sheets

SEMICONDUCTOR INTEGRATED CIRCUIT AND PROCESSOR

This application claims priority from Japanese Patent Application No. 2011-166070, filed on Jul. 28, 2011, the entire contents of which are hereby incorporated by reference.

BACKGROUND

1. Field

Embodiments described herein relate to a semiconductor integrated circuit and a processor.

2. Description of the Related Art

A cache memory is a major factor in determining the performance of a microprocessor. Since the area of a cache memory occupies a little less than half of that of the entire microprocessor, the power consumption of the cache memory accounts for a large part of that of the entire microprocessor. Conventionally, an SRAM (static random access memory) which can operate at high speed is used as a cache memory of a microprocessor. However, since the SRAM is a volatile memory, to continue storage of data therein, it is necessary to supply power to it all the time. Therefore, with increase in the degree of miniaturization, a problem arises that a large static power is required for an SRAM because of leak current occurring therein.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

According to exemplary embodiments of the present invention, there is provided a semiconductor integrated circuit. The semiconductor integrated circuit includes: a first inverter comprising a first input terminal and a first output terminal; a second inverter comprising a second input terminal and a second output terminal, wherein the second input terminal of the second inverter is connected to the first output terminal of the first inverter, and the second output terminal of the second inverter is connected to the first input terminal of the first inverter; a first transistor, wherein one end of the first transistor is connected to a first bit line and the other end of the first transistor is connected to the first input terminal of the first inverter; a first element group comprising a plurality of second transistors, wherein one end of the first element group is connected to the first output terminal of the first inverter and the other end of the first element group is connected to a second bit line; and a second element group comprising a plurality of third transistors and a magnetoresistive element whose magnetic resistance is varied, wherein the second element group is disposed between the second output terminal of the second inverter and a first terminal or disposed between the first transistor and the first terminal, and wherein a given potential is applied to the first terminal according to an operation. A sum of a resistance value of the magnetoresistive element and on-resistance values of the third transistors is smaller than a on-resistance value of the first element group, if the magnetoresistive element is in a small-resistance state. The sum of the resistance value of the magnetoresistive element and the on-resistance values of the third transistors is larger than the on-resistance value of the first group, if the magnetoresistive element is in a large-resistance state.

Embodiments of the present invention will be hereinafter described with reference to the drawings.

(Embodiment 1)

Figure 1:
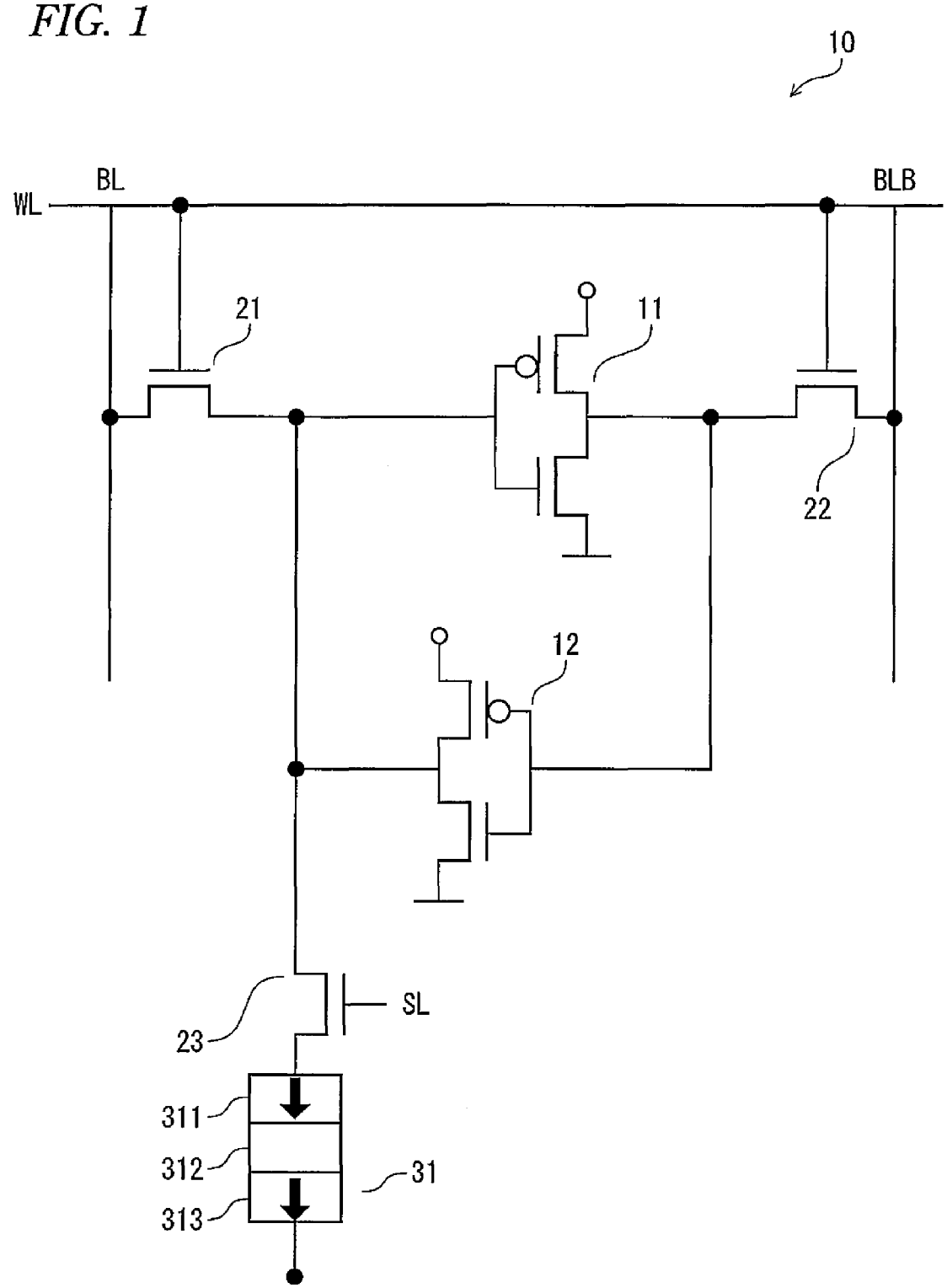
FIG. 1 shows a basic circuit configuration of a nonvolatile SRAM cell according to a first embodiment of the present invention.

FIG. 1 shows a basic circuit configuration of a nonvolatile SRAM cell 10 according to a first embodiment of the invention. As shown in FIG. 1, the nonvolatile SRAM cell 10 has inverters 11 and 12, transistors 21-23, and an MTJ (magnetic tunnel junction) 31.

Each of the first and second inverters 11 and 12 is composed of a p-channel MOSFET and an n-channel MOSFET which are connected to each other in series and provided between two power supply terminals Vdd and Vss. The first and second inverters 11 and 12 are cross coupled to each other.

The gate, source, and drain of the first transistor 21 are connected to a word line WL, a first bit line BL, and the input terminal of the first inverter 11, respectively. The gate, source, and drain of the second transistor 21 are connected to the word line WL, a second bit line BLB, and the input terminal of the second inverter 12, respectively. The gate, source, and drain of the third transistor 23 are connected to a switch line SL, the cross-coupled inverters 11 and 12, and the MTJ 31, respectively.

The MTJ 31 is a spin-injection magnetoresistive element having a magnetization fixed layer 311, a non-magnetic layer 312, and a magnetization free layer 313. The non-magnetic layer 312 is a tunneling insulating layer or is made of a non-magnetic metal. The magnetization fixed layer 311 and the magnetization free layer 313 of the MTJ 31 are connected to the third transistor 23 and a common potential electrode, respectively. In the MTJ 31, the spin direction of the magnetization free layer 313 is switched from the direction parallel with that of the magnetization fixed layer 311 to the direction antiparallel to it or vice versa according to the write current direction. The resistance of the MTJ 31 is small when the spin directions of the magnetization fixed layer 311 and the magnetization free layer 313 are parallel with each other, and is large when they are antiparallel to each other.

In the following description, it is assumed that when a write current is caused to flow in the direction from the magnetization fixed layer 311 to the magnetization free layer 313, the spin directions of the magnetization fixed layer 311 and the magnetization free layer 313 are switched to become antiparallel to each other (small resistance to large resistance) if they have been parallel with each other; and that when a write current is caused to flow in the direction from the magnetization free layer 313 to the magnetization fixed layer 311, the spin directions of the magnetization fixed layer 311 and the magnetization free layer 313 are switched to become parallel with each other (large resistance to small resistance) if they have been the antiparallel to each other.

Figure 2:
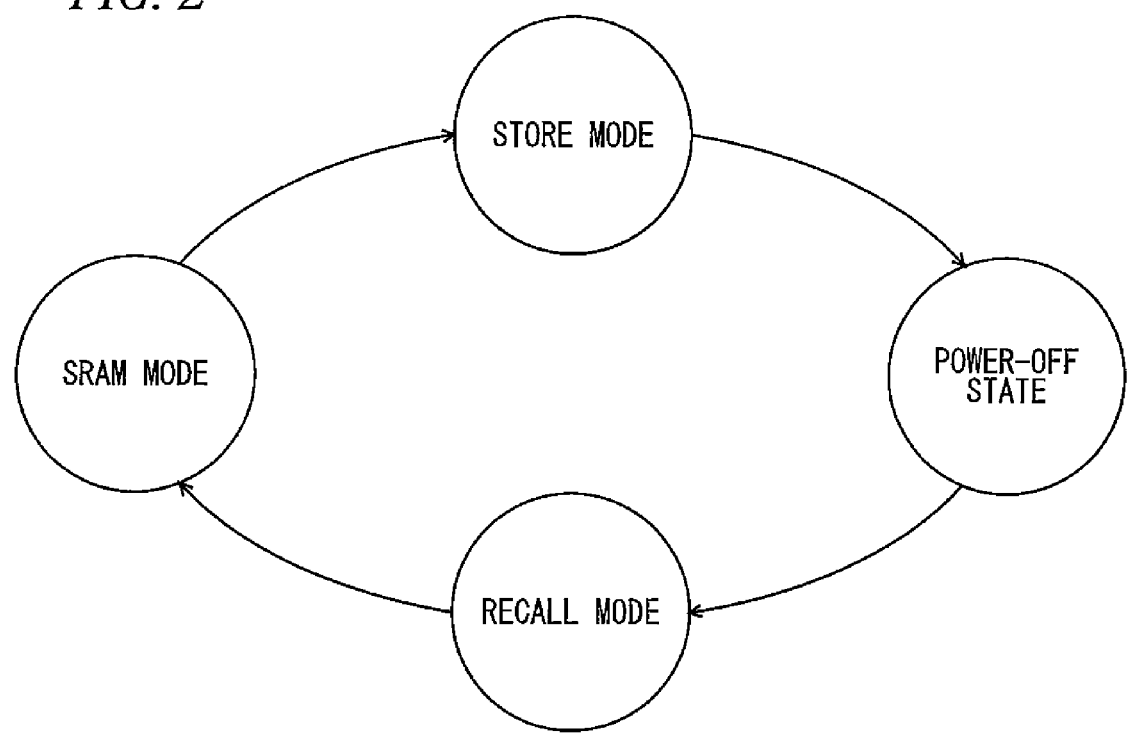
FIG. 2 is a state transition chart of the nonvolatile SRAM cell according to the first embodiment.

How the above-configured nonvolatile SRAM cell 10 operates will be described below. FIG. 2 is a state transition chart of the nonvolatile SRAM cell 10. If a control circuit (not shown) judges that the nonvolatile SRAM cell 10 will be accessed, a state that the nonvolatile SRAM cell 10 is supplied with power is maintained and the nonvolatile SRAM cell 10 operates as an SRAM cell. In the following, this state will be referred to as an SRAM mode. While the nonvolatile SRAM cell 10 is in the SRAM mode, high-speed data reading and writing can be performed on it.

On the other hand, if the control circuit judges that the nonvolatile SRAM cell 10 will not be accessed, the MTJ 31 stores data and the nonvolatile SRAM cell 10 is powered off (called a power-off state (see FIG. 2)). The leak current can thus be reduced. As described above, data is stored in the MTJ 31 while the nonvolatile SRAM cell 10 is not supplied with power, and is stored in the SRAM portion while the nonvolatile SRAM cell 10 is supplied with power. To this end, processing of transferring data from the SRAM portion to the MTJ 31 (a state in which this processing is performed is hereinafter referred to as a store mode) is performed before the nonvolatile SRAM cell 10 is powered off. And processing of returning data from the MTJ 31 to the SRAM portion (a state in which this processing is performed is hereinafter referred to as a recall mode) is performed when the nonvolatile SRAM cell 10 is powered on again.

More specifically, the state of the nonvolatile SRAM cell 10 is converted in the following manner. If the control circuit (not shown) judges that the nonvolatile SRAM cell 10 will be accessed, the nonvolatile SRAM cell 10 is rendered into the SRAM mode. If the control circuit thereafter judges that the nonvolatile SRAM cell 10 will not be accessed, a transition is made from the SRAM mode to the store mode. Upon completion of the processing performed in the store mode, the nonvolatile SRAM cell 10 is powered off (the power-off state is established). If the control circuit again judges that the nonvolatile SRAM cell 10 will be accessed, the nonvolatile SRAM cell 10 is rendered into the recall mode. Upon completion of the processing performed in the recall mode, the SRAM data becomes the same as that stored in the SRAM before the power-off.

Figure 3:
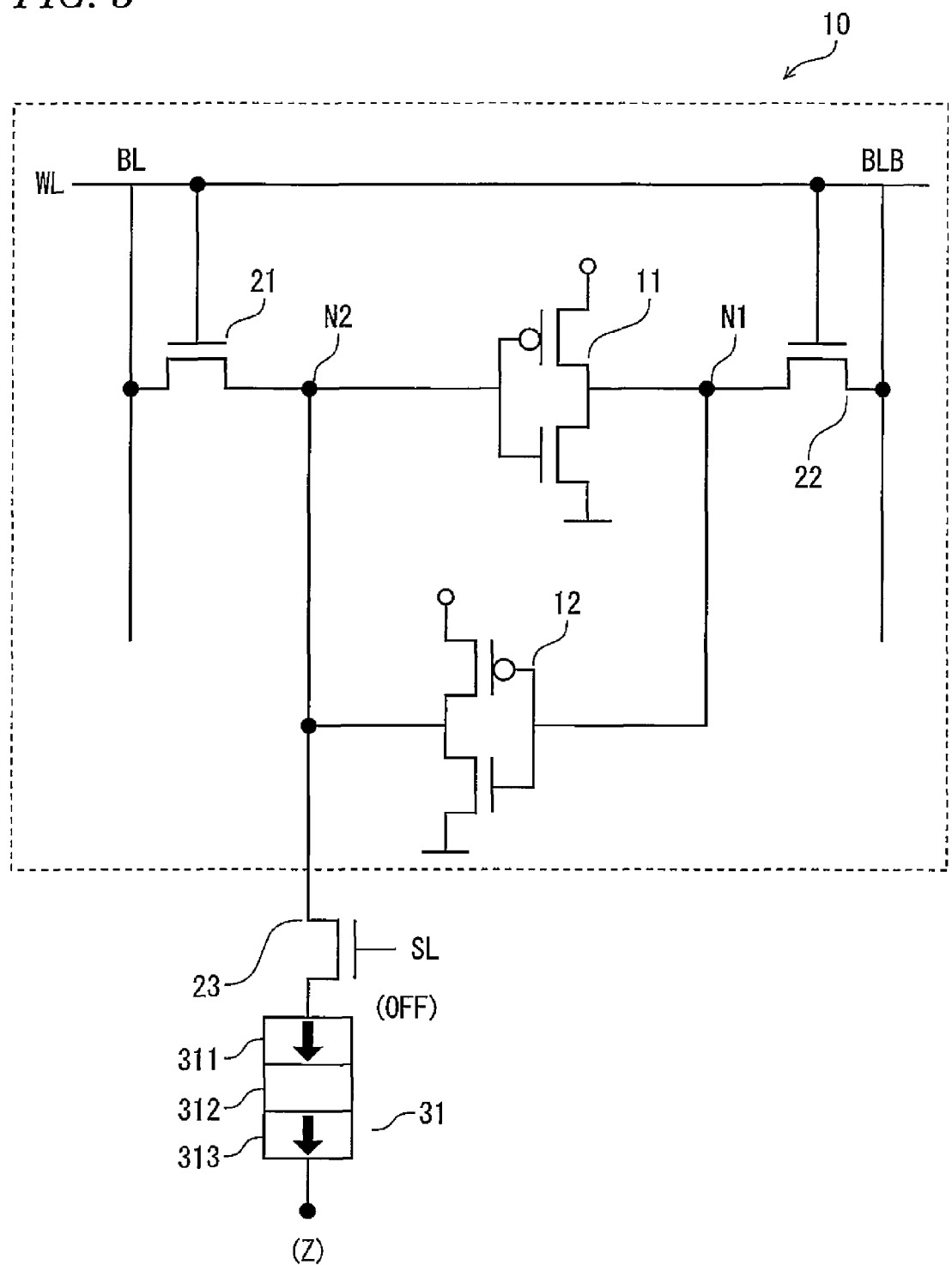
FIG. 3 shows an operation of the nonvolatile SRAM cell according to the first embodiment in an SRAM mode.

FIG. 3 shows how the nonvolatile SRAM cell 10 operates in the SRAM mode. To set the nonvolatile SRAM cell 10 in the SRAM mode, the potential of the switch line SL is set to a low potential "L" and the impedance of the common potential electrode to which the one end of the MTJ 31 is connected is set high, whereupon the third transistor 23 is turned off. As a result, the circuit enclosed by a broken line in FIG. 3 is separated from the MTJ 31 and the nonvolatile SRAM cell 10 comes to operate in the same manner as an ordinary SRAM cell. That is, the nonvolatile SRAM cell 10 stores data in a volatile manner and operates at a high speed like an ordinary SRAM cell.

To write data to the nonvolatile SRAM cell 10 being in the SRAM mode, the potential of one of the first bit line BL and the second bit line BLB is set to a high potential "H" and the other to a low potential "L" according to a write potential and then the potential of the word line WL is set to a high potential "H." For example, assume that the potentials of the first bit line BL and the second bit line BLB have been set to "H" and "L," respectively. If in this state the potential of the word line WL is set to "H" to turn on the first and second transistors 21 and 22, the output of the first inverter 11 (potential of a node N1) becomes "L" and the output of the second inverter 12 (potential of a node N2) becomes "H." This state is defined as a state that writes data "1" is stored.

On the other hand, if the potentials of the first bit line BL and the second bit line BLB are set to "L" and "H," respectively, and the potential of the word line WL is set to "H," the output of the first inverter 11 (potential of the node N1) becomes "H" and the output of the second inverter 12 (potential of the node N2) becomes "L." This state is defined as a state that writes data "0" is stored.

To read data from the nonvolatile SRAM cell 10 being in the SRAM mode, the potential of the word line WL is set to "H" to turn on the first and second transistors 21 and 22, whereupon the data stored in the nonvolatile SRAM cell 10 and its inverted value are transferred to the bit lines BL and BLB, respectively.

Figure 4:
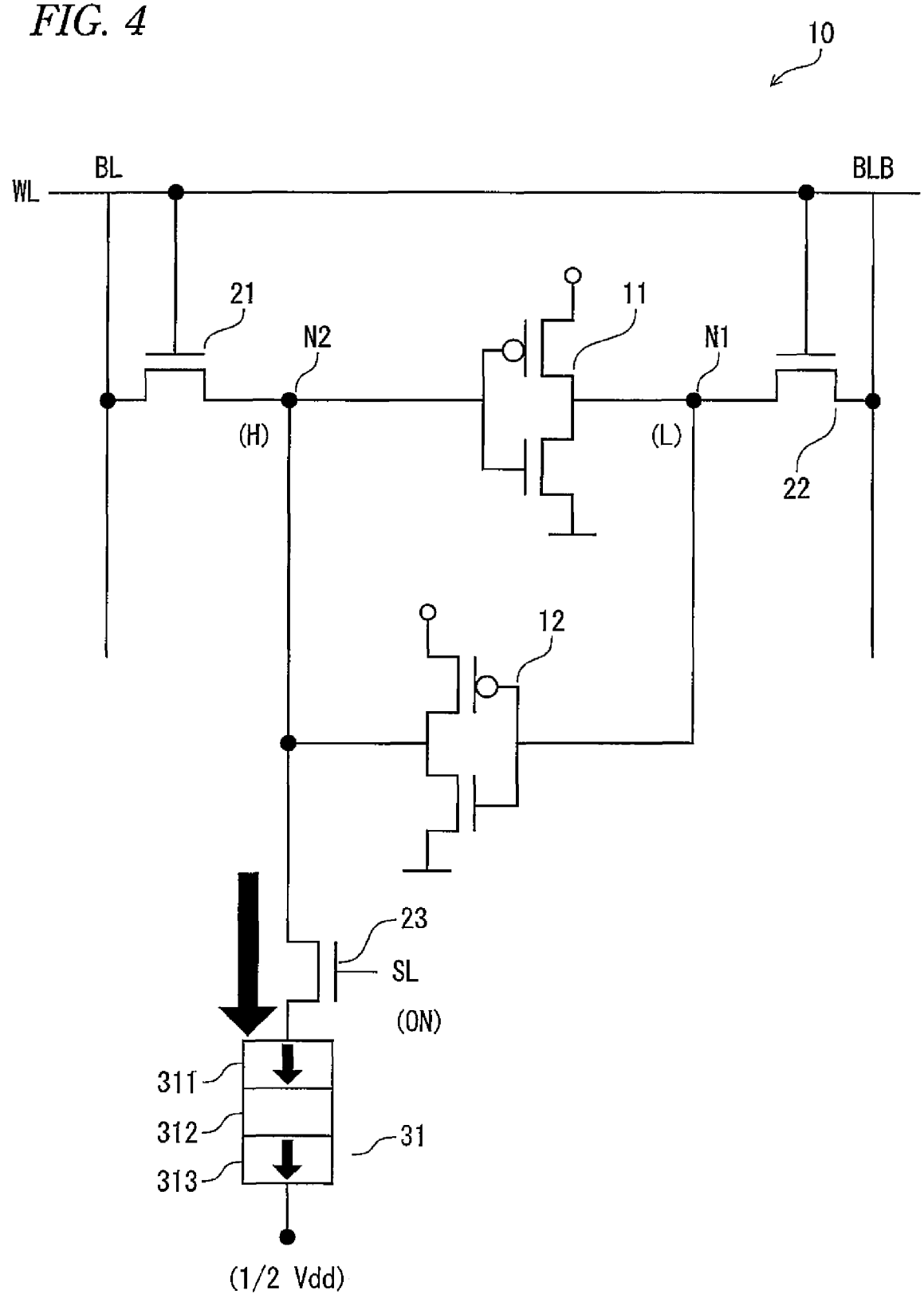
FIG. 4 shows an operation of the nonvolatile SRAM cell according to the first embodiment in a store mode.
Figure 5:
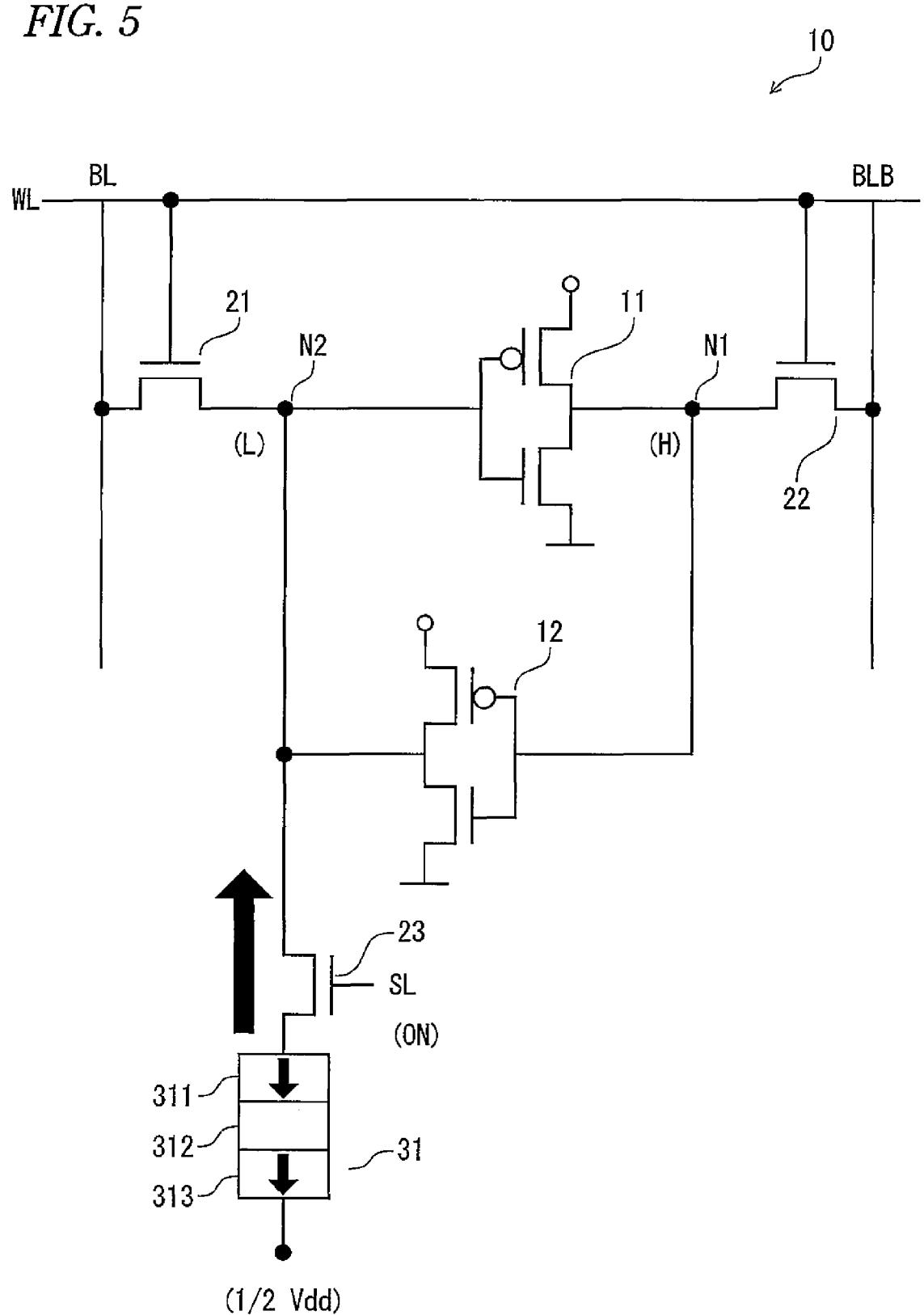
FIG. 5 shows another operation of the nonvolatile SRAM cell according to the first embodiment in the store mode.

FIGS. 4 and 5 show how the nonvolatile SRAM cell 10 operates in the store mode. FIG. 4 shows a state that the SRAM portion is stored with data "1" (the nodes L1 and L2 are at "L" and "H," respectively) at a start of the store mode. The common potential electrode which is connected to the MTJ 31 is given half of a reference voltage Vdd. The power supply terminals Vdd and Vss which are connected to the first inverter 11 and the second inverter 12 are separated from the power line and the ground line (rendered in a floating state). And the potential of the switch line SL is set to "H" to turn on the third transistor 23. Since the potential of the node N2 is "H" and hence higher than the potential Vdd/2, a write current flows in the direction from the magnetization fixed layer 311 of the MTJ 31 to its magnetization free layer 313. As a result, if the MTJ 31 has been in a small-resistance state, the spin directions of the magnetization fixed layer 311 and the magnetization free layer 313 of the MTJ 31 are switched from the parallel state to the antiparallel state and the resistance of the MTJ 31 is switched to the large resistance.

On the other hand, FIG. 5 shows a state that the SRAM portion is stored with data "0" (the nodes L1 and L2 are at "H" and "L," respectively) at a start of the store mode. In this case, the common potential electrode which is connected to the MTJ 31 is given half of the reference voltage Vdd and the potential of the switch line SL is set to "H" to turn on the third transistor 23. Since the potential of the node N2 is "L" and hence lower than the potential Vdd/2, a write current flows in the direction from the magnetization free layer 313 of the MTJ 31 to its magnetization fixed layer 311. As a result, if the MTJ 31 has been in a large-resistance state, the spin directions of the magnetization fixed layer 311 and the magnetization free layer 313 of the MTJ 31 are switched from the antiparallel state to the parallel state and the resistance of the MTJ 31 is switched to the small resistance.

Figure 6:
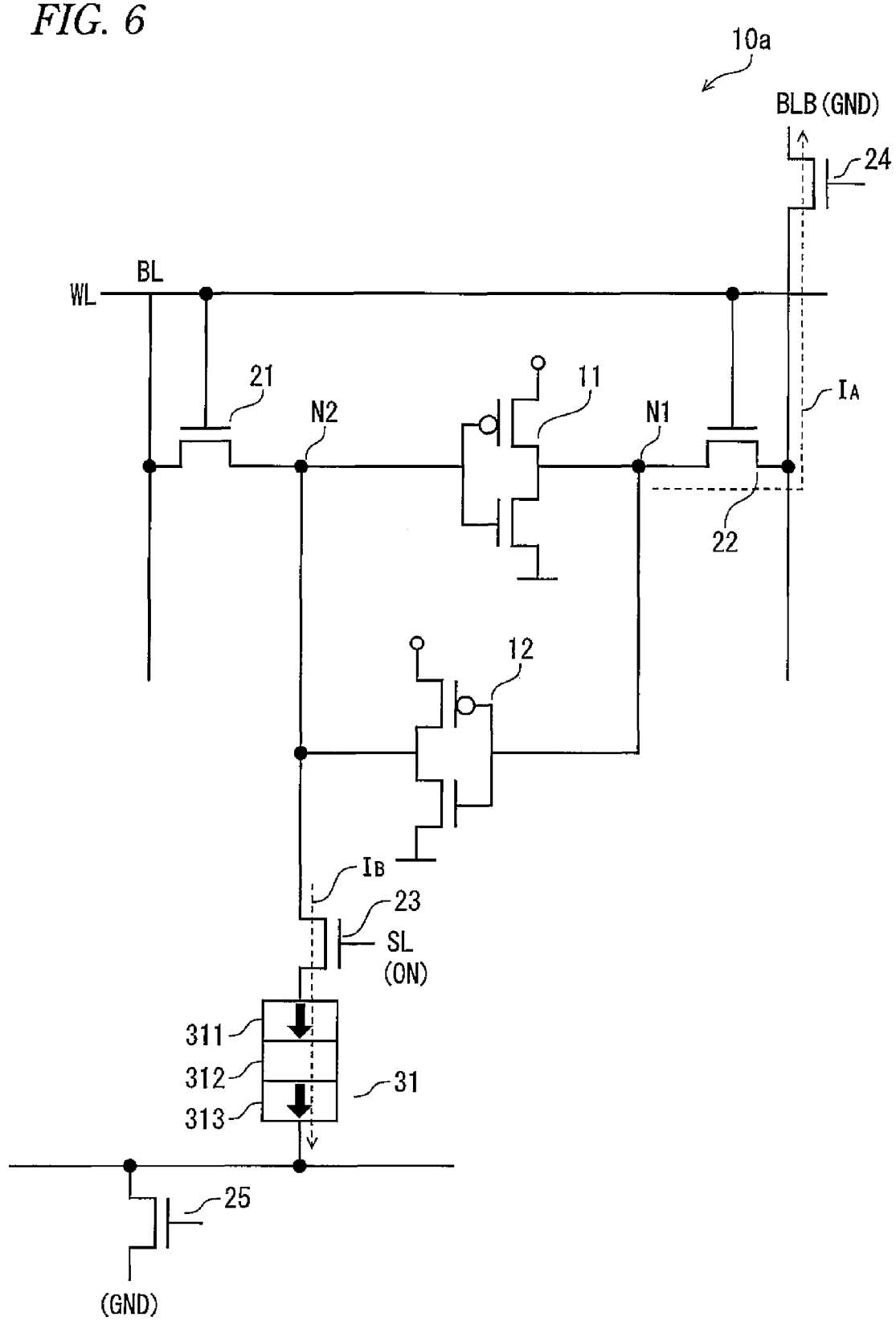
FIG. 6 is a circuit diagram of a nonvolatile SRAM cell according to the first embodiment which realizes recall.

FIG. 6 is a circuit diagram of a nonvolatile SRAM cell 10a for realizing recall. To realize recall, the nonvolatile SRAM cell 10a has a fourth transistor 24 and a fifth transistor 25 in addition to the components of the above-described nonvolatile SRAM cell 10. One end of the fourth transistor 24 is connected to the second bit line BLB and the other end is connected to the source of the second transistor 22. The second bit line BLB is grounded. One end of the fifth transistor 25 is connected to the MTJ 31 and the other end is grounded. In the thus-configured nonvolatile SRAM cell 10a, data stored in the MTJ 31 is automatically recalled to the SRAM portion utilizing the large and small resistance values of the MTJ 31.

To realize recall, an on-resistance $R_{TR2}$ of the second transistor 22, an on-resistance $R_{TR3}$ of the third transistor 23, an on-resistance $R_{TR4}$ of the fourth transistor 24, an on-resistance $R_{TR5}$ of the fifth transistor 25, the small resistance $R_P$ of the MTJ 31, and the large resistance $R_{AP}$ of the MTJ 31 are set so as to satisfy the relationship of Equation (1). In the following description, the term "resistance of a transistor" means an on-resistance of the transistor.

$$(R_P+R_{TR3}+R_{TR5})<(R_{TR2}+R_{TR4})<(R_{AP}+R_{TR3}+R_{TR5}) \quad (1)$$

That is, the above resistance values are set so that the sum of the resistance values of the transistors and the MTJ 31 located between the node N2 to the grounded electrode is smaller than the sum of the resistance values of the transistors located between the mode N1 and the grounded electrode if the MTJ 31 is in the small-resistance state, and is larger than the sum of the resistance values of the transistors located between the mode N1 and the grounded electrode if the MTJ 31 is in the large-resistance state.

The above resistance values of the respective transistors can be set so as to satisfy Equation (1) by changing their channel widths. With this setting of the resistance values, when the second to fifth transistors 22-25 are turned on simultaneously, a current $I_A$ flowing through the second transistor 22 and the fourth transistor 24 and a current $I_B$ flowing through the third transistor 23, the fifth transistor 25, and the MTJ 31 have the following relationship.

If the MTJ 31 is in the antiparallel state (large-resistance state), since the relationship $(R_{TR2}+R_{TR4})<(R_{AP}+R_{TR3}+R_{TR5})$ holds, the current $I_A$ is larger than the current $I_B$ ($I_B<I_A$). As a result, the potential of the node N1 becomes "L" (0 V) earlier than that of the node N2. Therefore, "L" is input to the second inverter 12 and the potential of the node N2 is made "H" by an output of the second inverter 12. Therefore, the potentials of the nodes N2 and N1 are fixed to "H" and "L," respectively. This means that original data "1" has been recalled to the SRAM portion.

If the MTJ 31 is in the parallel state (small-resistance state), since the relationship $(R_P+R_{TR3}+R_{TR5})<(R_{TR2}+R_{TR4})$ holds, the current $I_B$ is larger than the current $I_A$ ($I_A<I_B$). As a result, the potential of the node N2 becomes "L" (0 V) earlier than that of the node N1. Therefore, "L" is input to the first inverter 11 and the potential of the node N1 is made "H" by an output of the first inverter 11. Therefore, the potentials of the nodes N1 and N2 are fixed to "H" and "L," respectively. This means that original data "0" has been recalled to the SRAM portion.

In the embodiment, the nonvolatile SRAM cell 10a has such a circuit configuration that in the recall mode data is recalled to the SRAM portion utilizing the large and small resistance values of the MTJ 31. An alternative configuration is possible in which a sense amplifier for reading data from the MTJ 31 is provided and a recall is performed by writing read-out data to the SRAM portion by the same method as the above-described data writing method used in the SRAM mode.

As described above, in the nonvolatile SRAM cell 10 according to the embodiment, data reading or writing is performed at high speed in the SRAM mode in the case where a cache is accessed. Where the cache is not be accessed, data is stored in the MTJ 31 and the nonvolatile SRAM cell 10 is powered off, whereby the leak current can be reduced.

Figure 7:
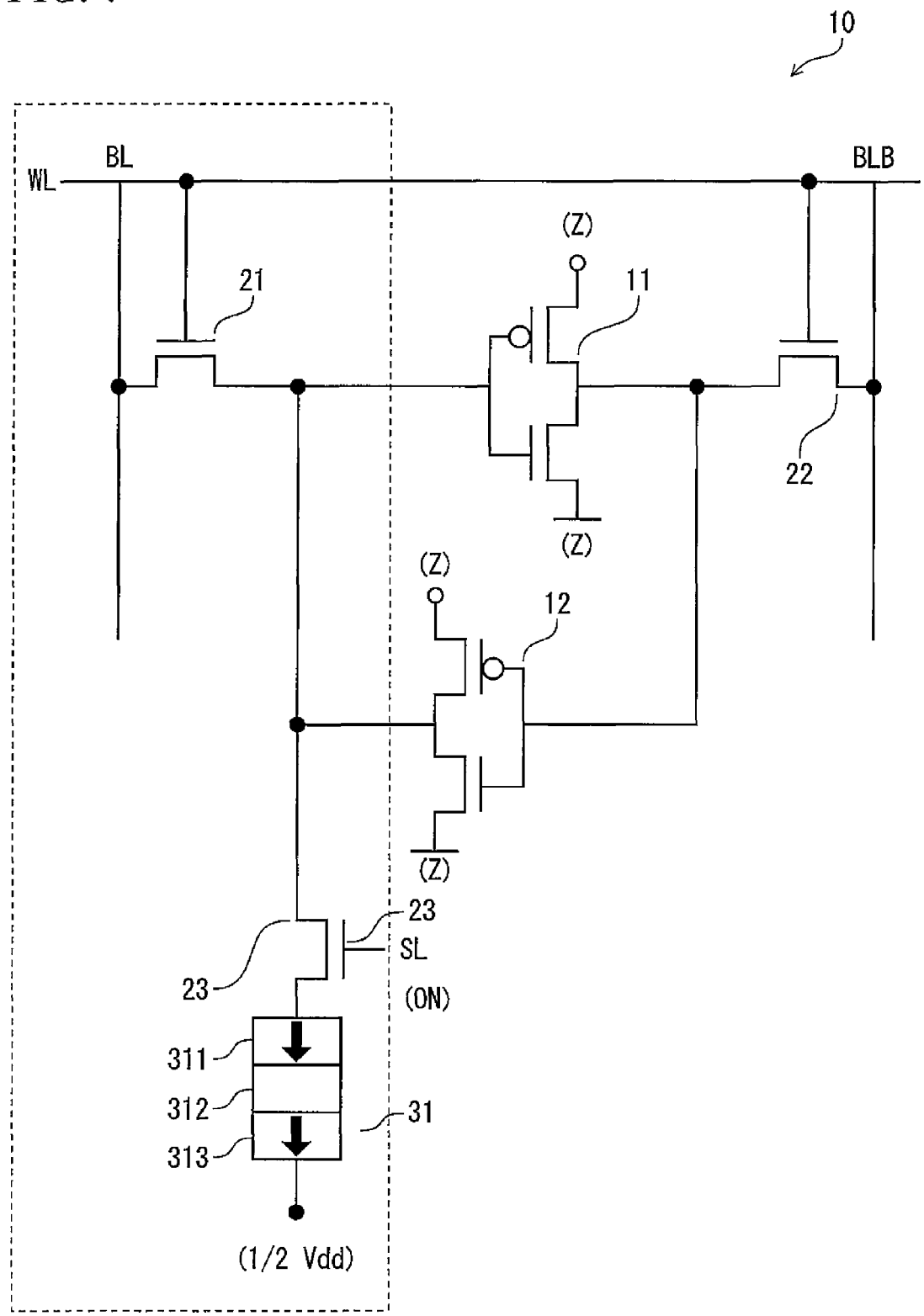
FIG. 7 shows how the nonvolatile SRAM cell according to the first embodiment operates when it is used as an MRAM.

It is possible to cause the nonvolatile SRAM cell 10 according to the embodiment to operate as an MRAM. FIG. 7 shows how the nonvolatile SRAM cell 10 operates when it is used as a 1-bit MRAM. In the following description, this mode will be referred to as an MRAM mode. In the MRAM mode, the power supply terminals Vdd and Vss which are connected to the first inverter 11 and the second inverter 12 are separated from the power line and the ground line (rendered in a floating state), that is, the entire nonvolatile SRAM cell 10 is disconnected from the power line and the ground line. As a result, the circuit that has the two inverters 11 and 12 and is to function as an SRAM is rendered in an electrically floating state and does not function actually. The circuit enclosed by a broken line in FIG. 7 (i.e., the circuit consisting of the first transistor 21, the third transistor 23, and the MTJ 31) operates as a I-bit MRAM circuit. In the MRAM mode, the common potential electrode which is connected to the MTJ 31 is given half of the reference voltage Vdd.

To write data into the nonvolatile SRAM cell 10 in the MRAM mode, the potential of the word line WL is set to "H" to turn on the first transistor 21, the potential of the switch line SL is set to "H" to turn on the third transistor 23, and either the same voltage as the reference voltage Vdd or 0 V is applied to the bit line BL according to write data. As a result, a write current flows through the MTJ 31.

If the voltage applied to the bit line BL is the same voltage as the reference voltage Vdd, the write current flows in the direction from the magnetization fixed layer 311 to the magnetization free layer 313. As a result, if the MTJ 31 has been in the small-resistance state, the spin directions of the magnetization fixed layer 311 and the magnetization free layer 313 are switched from the parallel state to the antiparallel state and the resistance of the MTJ 31 is switched to the large resistance.

On the other hand, if the voltage applied to the bit line BL is 0 V, the write current flows in the direction from the magnetization free layer 313 to the magnetization fixed layer 311. As a result, if the MTJ 31 has been in the large-resistance state, the spin directions of the magnetization fixed layer 311 and the magnetization free layer 313 are switched from the antiparallel state to the parallel state and the resistance of the MTJ 31 is switched to the small resistance. In this manner, data can be written to the MTJ 31 according to the direction of a write current.

(Modification 1)

Figure 8:
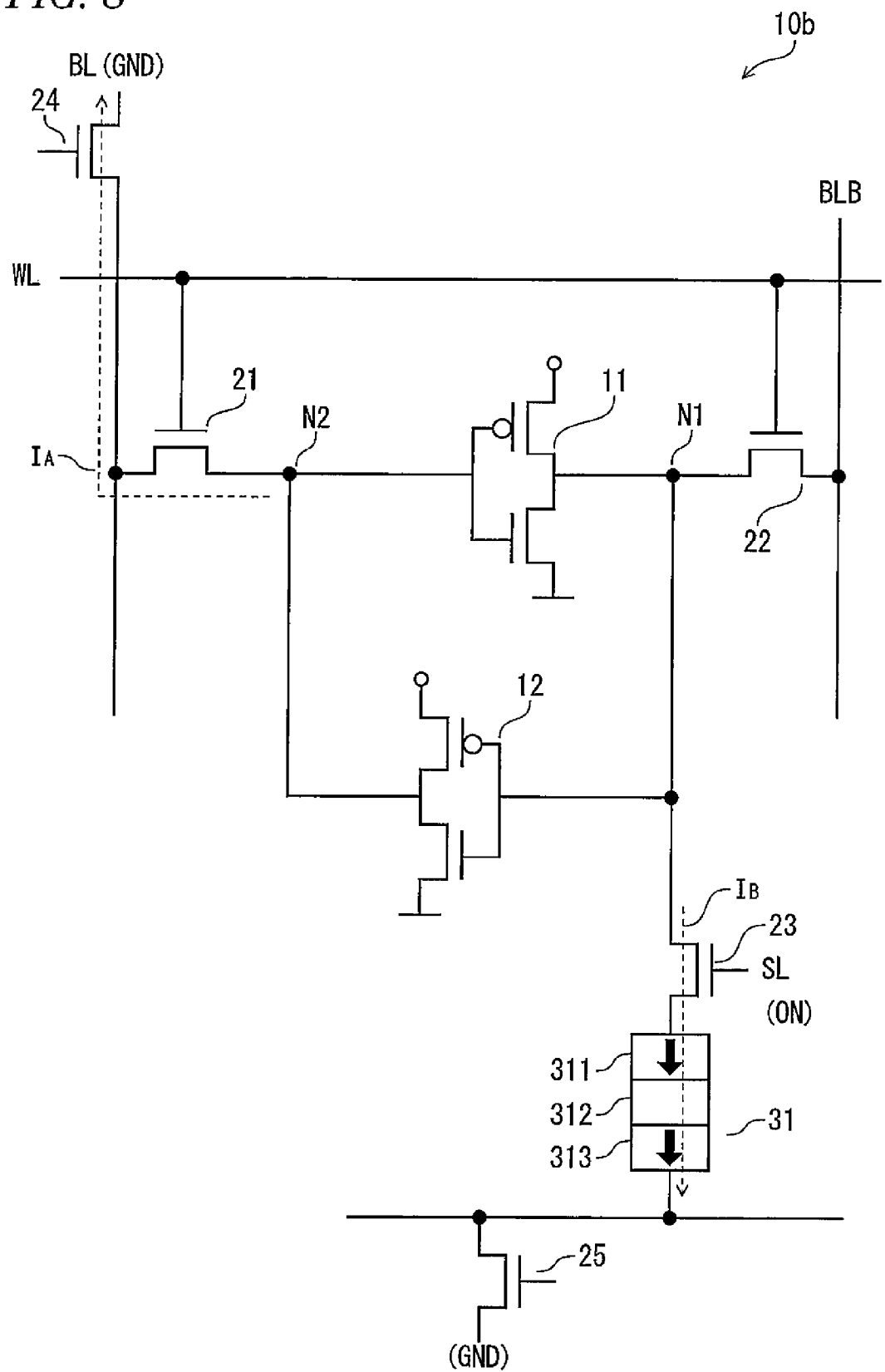
FIG. 8 shows a recall operation of a nonvolatile SRAM cell according to a first modification of the first embodiment.

Various modifications of the above-described first embodiment are conceivable. FIG. 8 shows a recall operation of a nonvolatile SRAM cell 10b according to a first modification of the first embodiment. In the nonvolatile SRAM cell 10b, the third transistor 23 is connected to the node N1 and the MTJ 31. The SRAM mode of this medication will not be described in detail because data can be read and written in the same manners as described above for the nonvolatile SRAM cell 10 (see FIG. 3).

In the store mode, in the nonvolatile SRAM cell 10 according to the first embodiment, the MTJ 31 is rendered into the large-resistance state if the SRAM portion is stored with data "1" and into the small-resistance state in the SRAM portion is stored with data "0" (see FIGS. 4 and 5). In the nonvolatile SRAM cell 10b according to this medication, the MTJ 31 is rendered into the resistance state opposite to the above.

For example, in the nonvolatile SRAM cell 10b, if the potential of the node N1 is "L" (data "1" is stored in the SRAM portion) at a start of the store mode, a write current flows in the direction from the magnetization free layer 313 to the magnetization fixed layer 311 because the potential of the node N1 is lower than the potential (Vdd/2) of the common potential electrode. As a result, if the MTJ 31 has been in the large-resistance state, the spin directions of the magnetization fixed layer 311 and the magnetization free layer 313 are switched from the antiparallel state to the parallel state and the resistance of the MTJ 31 is switched to the small resistance. On the other hand, if the potential of the node N1 is "H" (data "0" is stored in the SRAM portion), a write current flows in the direction from the magnetization fixed layer 311 to the magnetization free layer 313. As a result, if the MTJ 31 has been in the small-resistance state, the resistance of the MTJ 31 is switched to the large resistance.

To perform a recall in the nonvolatile SRAM cell 10b, the resistance $R_{TR1}$ of the first transistor 22, the resistance $R_{TR3}$ of the third transistor 23, the resistance $R_{TR4}$ of the fourth transistor 24, the resistance $R_{TR5}$ of the fifth transistor 25, the small resistance $R_P$ of the MTJ 31, and the large resistance $R_{AP}$ of the MTJ 31 are set so as to satisfy the relationship of Equation (2):

$$(R_P+R_{TR3}+R_{TR5})<(R_{TR1}+R_{TR4})<(R_{AP}+R_{TR3}+R_{TR5}) \quad (2)$$

With the setting of Equation (2), when the first transistor 21 and the third to fifth transistors 23-25 are turned on simultaneously, a current $I_A$ flowing through the first transistor 21 and the fourth transistor 24 and a current $I_B$ flowing through the third transistor 23, the fifth transistor 25, and the MTJ 31 have the following relationship.

If the MTJ 31 is in the antiparallel state (large-resistance state), since the relationship $(R_{TR1}+R_{TR4})<(R_{AP}+R_{TR3}+R_{TR5})$ holds, the current $I_A$ is larger than the current $I_B$ ($I_B<I_A$). As a result, the potential of the node N2 becomes "L" earlier than that of the node N1. Therefore, "L" is input to the first inverter 11 and the potentials of the nodes N1 and N2 are fixed to "H" and "L," respectively. This means that original data "0" has been recalled to the SRAM portion.

On the other hand, if the MTJ 31 is in the parallel state (small-resistance state), since the relationship $(R_P+R_{TR3}+R_{TR5})<(R_{TR1}+R_{TR4})$ holds, the current $I_B$ is larger than the current $I_A$ ($I_A<I_B$). As a result, the potential of the node N1 becomes "L" earlier than that of the node N2. Therefore, "L" is input to the second inverter 12 and the potentials of the nodes N2 and N1 are fixed to "H" and "L," respectively. This means that original data "1" has been recalled to the SRAM portion. In this manner, the nonvolatile SRAM cell 10b can operate in the same manner as the nonvolatile SRAM cell 10a (see FIG. 6).

(Modification 2)

Figure 9:
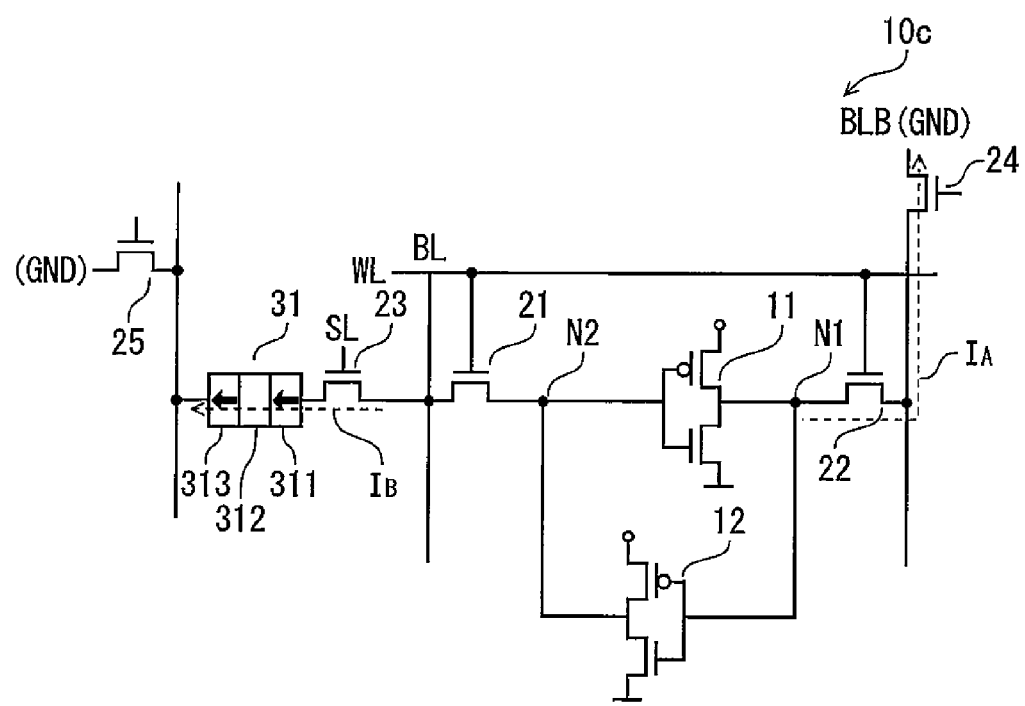
FIG. 9 shows a recall operation of a nonvolatile SRAM cell according to a second modification of the first embodiment.

FIG. 9 shows a recall operation of a nonvolatile SRAM cell 10c according to a second modification of the first embodiment. In the nonvolatile SRAM cell 10c, one end of the third transistor 23 is connected to the first transistor 21 and the other end is connected to the MTJ 31. The SRAM mode of this medication will not be described in detail because data can be read and written in the same manners as described above for the nonvolatile SRAM cell 10 (see FIG. 3).

In the nonvolatile SRAM cell 10c, in the store mode, half of the reference voltage Vdd is applied to the common potential electrode which is connected to the MTJ 31 and the first transistor 21 and the third transistor 23 are turned on. As a result, data stored in the SRAM portion can be transferred in the MTJ 31 in the same manners as described above for the nonvolatile SRAM cell 10 being in the store mode (see FIGS. 4 and 5).

To perform a recall in the nonvolatile SRAM cell 10c, the resistance $R_{TR1}$ of the first transistor 21, the resistance $R_{TR2}$ of the second transistor 22, the resistance $R_{TR3}$ of the third transistor 23, the resistance $R_{TR4}$ of the fourth transistor 24, the resistance $R_{TR5}$ of the fifth transistor 25, the small resistance $R_P$ of the MTJ 31, and the large resistance $R_{AP}$ of the MTJ 31 are set so as to satisfy the relationship of Equation (3):

$$(R_P+R_{TR1}+R_{TR3}+R_{TR5})<(R_{TR2}+R_{TR4})<(R_{AP}+R_{TR1}+R_{TR3}+R_{TR5}) \quad (3)$$

With the setting of Equation (3), when the first to fifth transistors 21-25 are turned on simultaneously, a current $I_A$ flowing through the second transistor 22 and the fourth transistor 24 and a current $I_B$ flowing through the first transistor 21, the third transistor 23, the fifth transistor 25, and the MTJ 31 have the following relationship.

If the MTJ 31 is in the antiparallel state (large-resistance state), since the relationship $(R_{TR2}+R_{TR4})<(R_{AP}+R_{TR1}+R_{TR3}+R_{TR5})$ holds, the current $I_A$ is larger than the current $I_B$ ($I_B<I_A$). As a result, the potential of the node N1 becomes "L" earlier than that of the node N2. Therefore, "L" is input to the second inverter 12 and the potentials of the nodes N2 and N1 are fixed to "H" and "L," respectively. This means that original data "1" has been recalled to the SRAM portion.

On the other hand, if the MTJ 31 is in the parallel state (small-resistance state), since the relationship $(R_P+R_{TR1}+R_{TR3}+R_{TR5})<(R_{TR2}+R_{TR4})$ holds, the current $I_B$ is larger than the current $I_A$ ($I_A<I_B$). As a result, the potential of the node N2 becomes "L" earlier than that of the node N1. Therefore, "L" is input to the first inverter 11 and the potentials of the nodes N1 and N2 are fixed to "H" and "L," respectively. This means that original data "0" has been recalled to the SRAM portion. In this manner, the nonvolatile SRAM cell 10c can operate in the same manner as the nonvolatile SRAM cell 10a (see FIG. 6).

Figure 10:
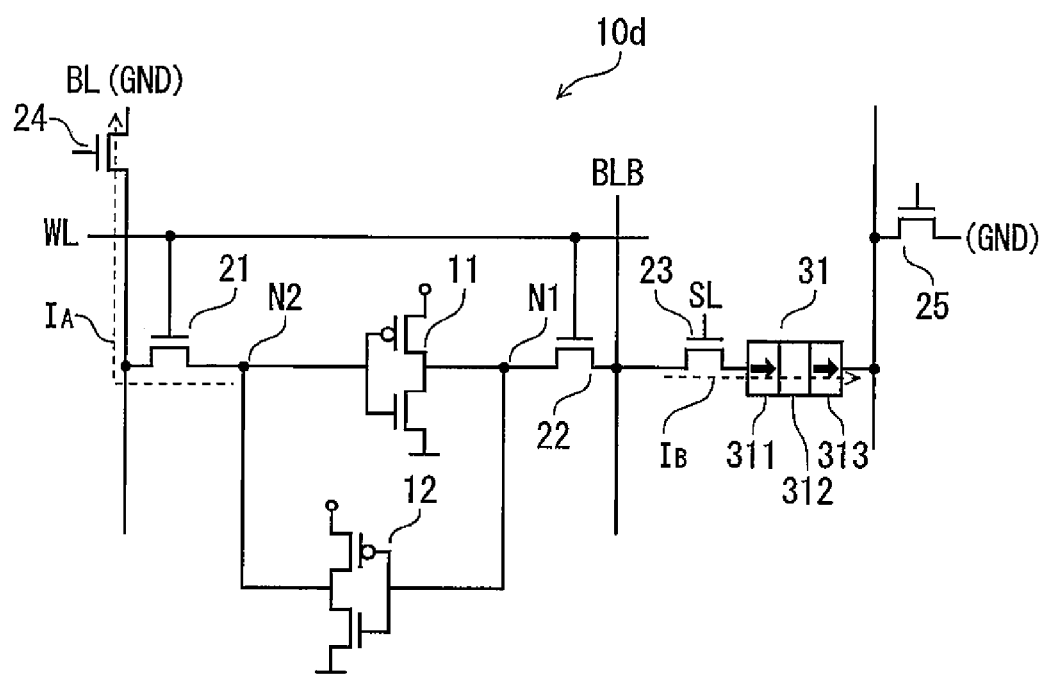
FIG. 10 shows a recall operation of another nonvolatile SRAM cell according to the second modification of the first embodiment.

FIG. 10 shows an alternative configuration in which one end of the third transistor 23 is connected to the second transistor 22 and the other end is connected to the MTJ 31. In this case, in the store mode, the MTJ 31 is rendered into the small-resistance mode if the SRAM portion is stored with data "1" and into the large-resistance state if the SRAM portion is stored with data "0." To realize the recall mode, the resistances of the transistors 21-25 are set so as to satisfy the relationship of Equation (4):

$$(R_P+R_{TR2}+R_{TR3}+R_{TR5})<(R_{TR1}+R_{TR4})<(R_{AP}+R_{TR2}+R_{TR3}+R_{TR5}) \quad (4)$$

With this setting, the nonvolatile SRAM cell 10d shown in FIG. 10 can operate in the same manner as the nonvolatile SRAM cell 10a (see FIG. 6).

In the first embodiment, the magnetization fixed layer 311 of the MTJ 31 is connected to the third transistor 23 and its magnetization free layer 313 is connected to the common potential electrode. An alternative configuration is possible in which the magnetization fixed layer 311 is connected to the common potential electrode and the magnetization free layer 313 is connected to the third transistor 23.

(Embodiment 2)

Figure 11:
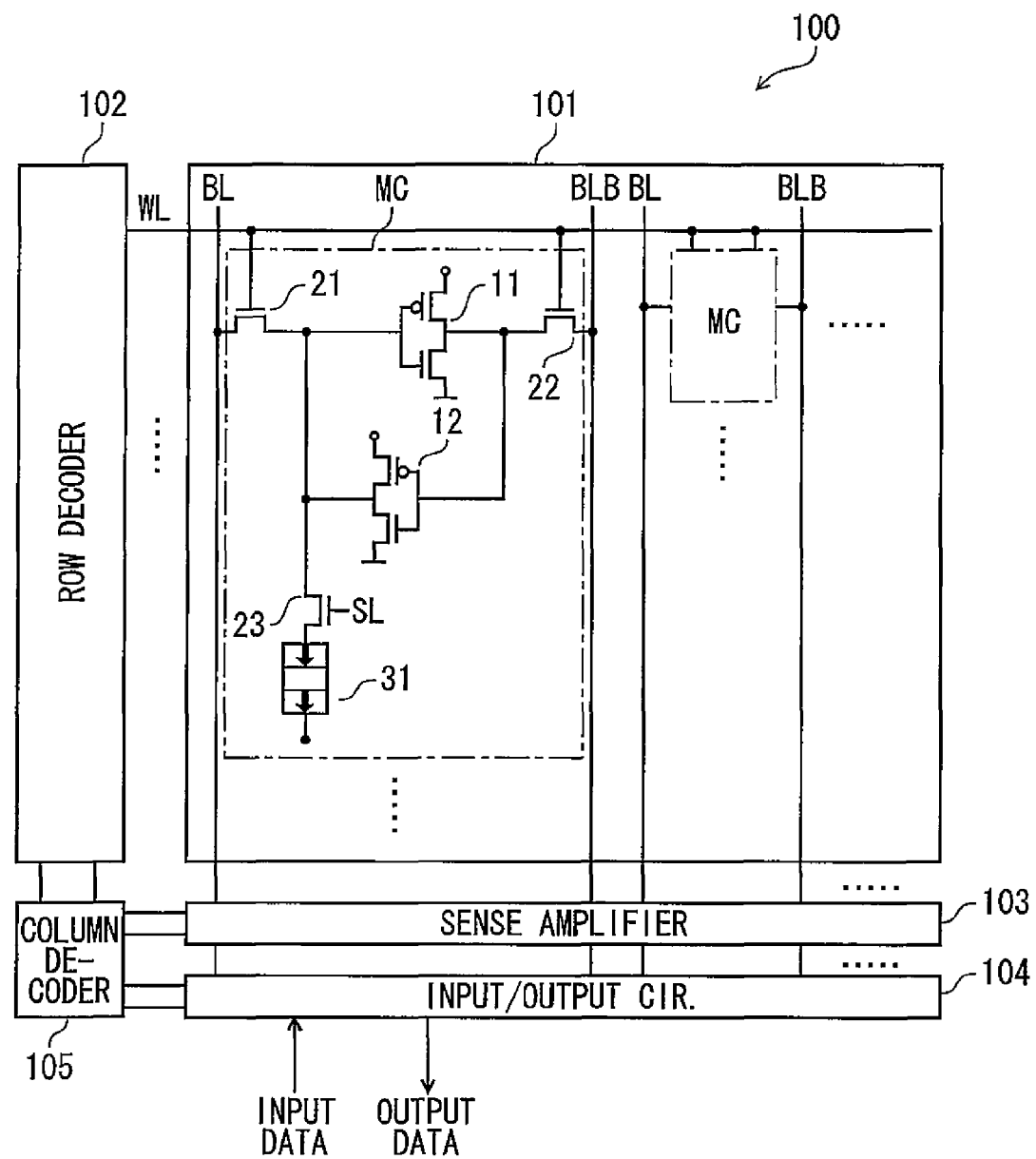
FIG. 11 shows a basic configuration of a nonvolatile SRAM according to a second embodiment of the invention which employs the nonvolatile SRAM cell according to the first embodiment.

FIG. 11 shows a basic configuration of a nonvolatile SRAM 100 which employs the above-described nonvolatile SRAM cell 10 (MC) according to the first embodiment. Plural nonvolatile SRAM cells MC are arranged so as to form a memory cell array 101. A row decoder 102 for selecting one of plural word lines WL of the memory cell array 101 is connected to the memory cell array 101. A sense amplifier 103 is also connected to the memory cell array 101, and an input/output circuit 104 is connected to the sense amplifier 103.

A column decoder 105 is provided which selects one of plural pairs of bit lines BL and BLB of the memory cell array 101. The column decoder 105 outputs information indicating the selected bit line pair to the input/output circuit 104 and the sense amplifier 103. To read data from a memory cell MC of the nonvolatile SRAM 100, the data of the memory cell is output to a bit line pair specified by the column decoder 105, amplified by the sense amplifier 103, and output from the input/output circuit 104. To write data to a memory cell MC of the nonvolatile SRAM 100, write data is supplied to the input/output circuit 104. When a bit line pair is selected by the column decoder 105, the write data is written to a memory cell MC that is located at the intersecting point of the selected bit line pair and a word line WL selected by the row decoder 102.

Figure 12:
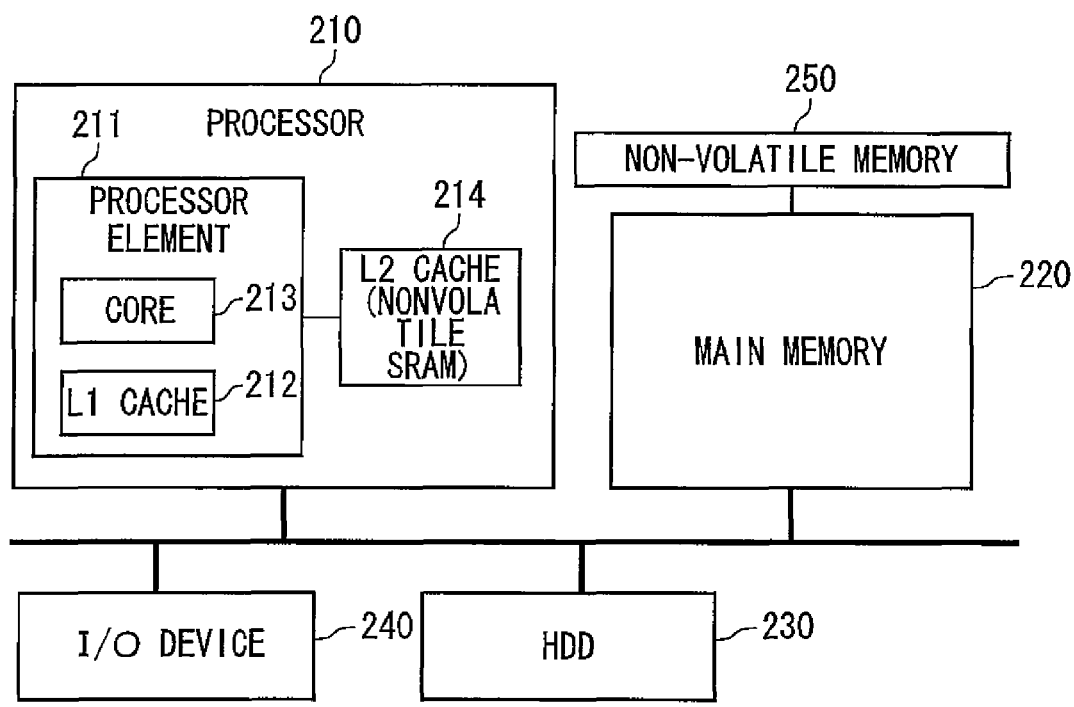
FIG. 12 is a block diagram of an information processing apparatus which employs the nonvolatile SRAM of FIG. 11 as a cache.

FIG. 12 is a block diagram of an information processing apparatus (e.g., PC) which employs the above nonvolatile SRAM 100 as a cache. In this example, the nonvolatile SRAM 100 is used as an L2 cache 214 which is incorporated in a processor 210. The access frequency of the L2 cache 214 is lower than that of a processor element 211 of the processor 210. Therefore, the power consumption of the processor 210 can be reduced by powering off the L2 cache 214 (nonvolatile SRAM 100) if a processor core 213 judges it proper to power off the L2 cache 214.

(Embodiment 3)

Figure 13:
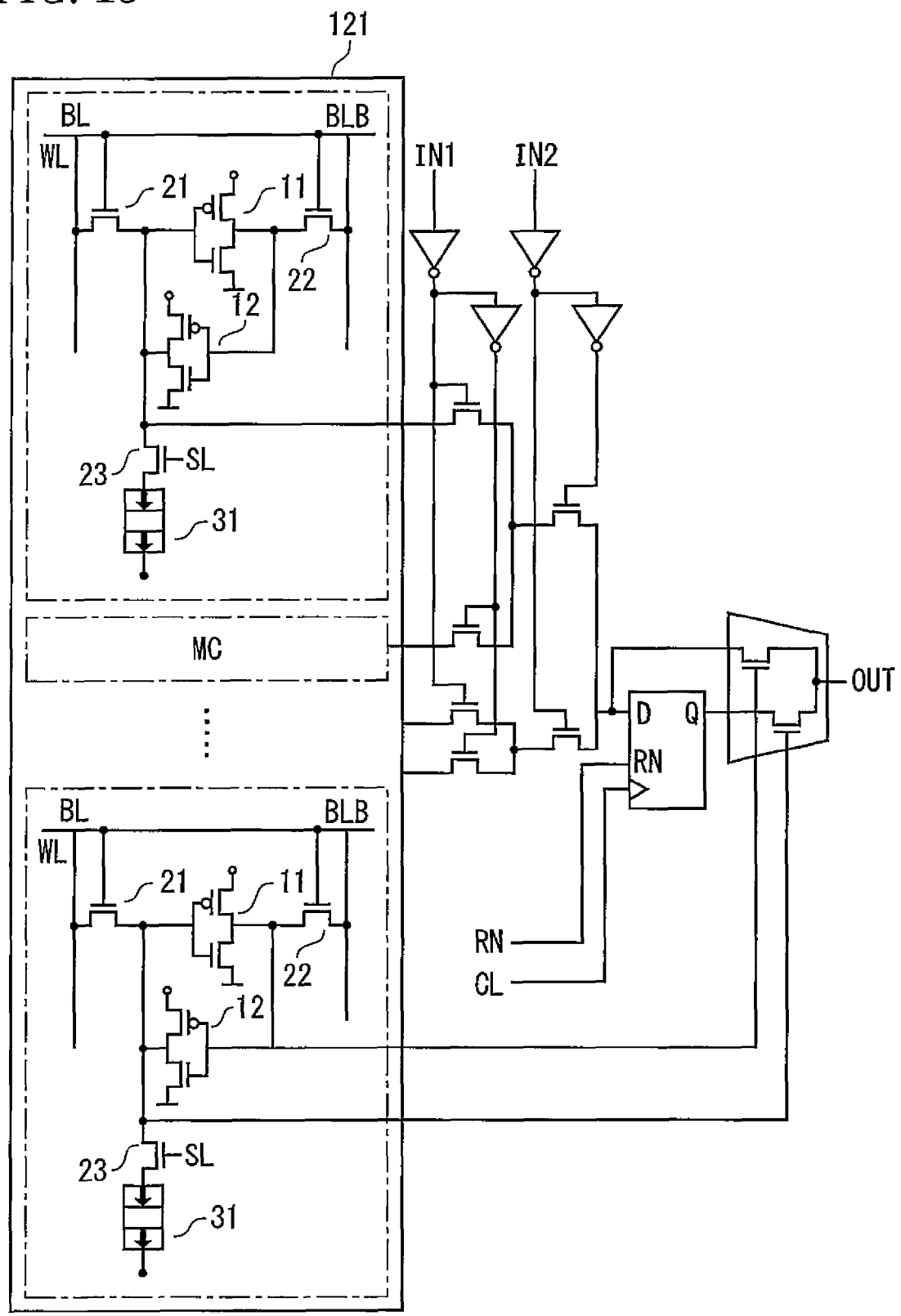
FIG. 13 shows an FPGA according to a third embodiment of the invention which employs the nonvolatile SRAM cell according to the first embodiment.

FIG. 13 shows a first example FPGA (field-programmable gate array) which employs the above-described nonvolatile SRAM cell 10 (MC) according to the first embodiment. In this FPGA, plural nonvolatile SRAM cells MC are arranged so as to form a memory cell array 121. As shown in FIG. 13, data stored in the nonvolatile SRAM cells MC can be used for switching of an LUT (look-up table) or a multiplexer of the FPGA.

Figure 14:
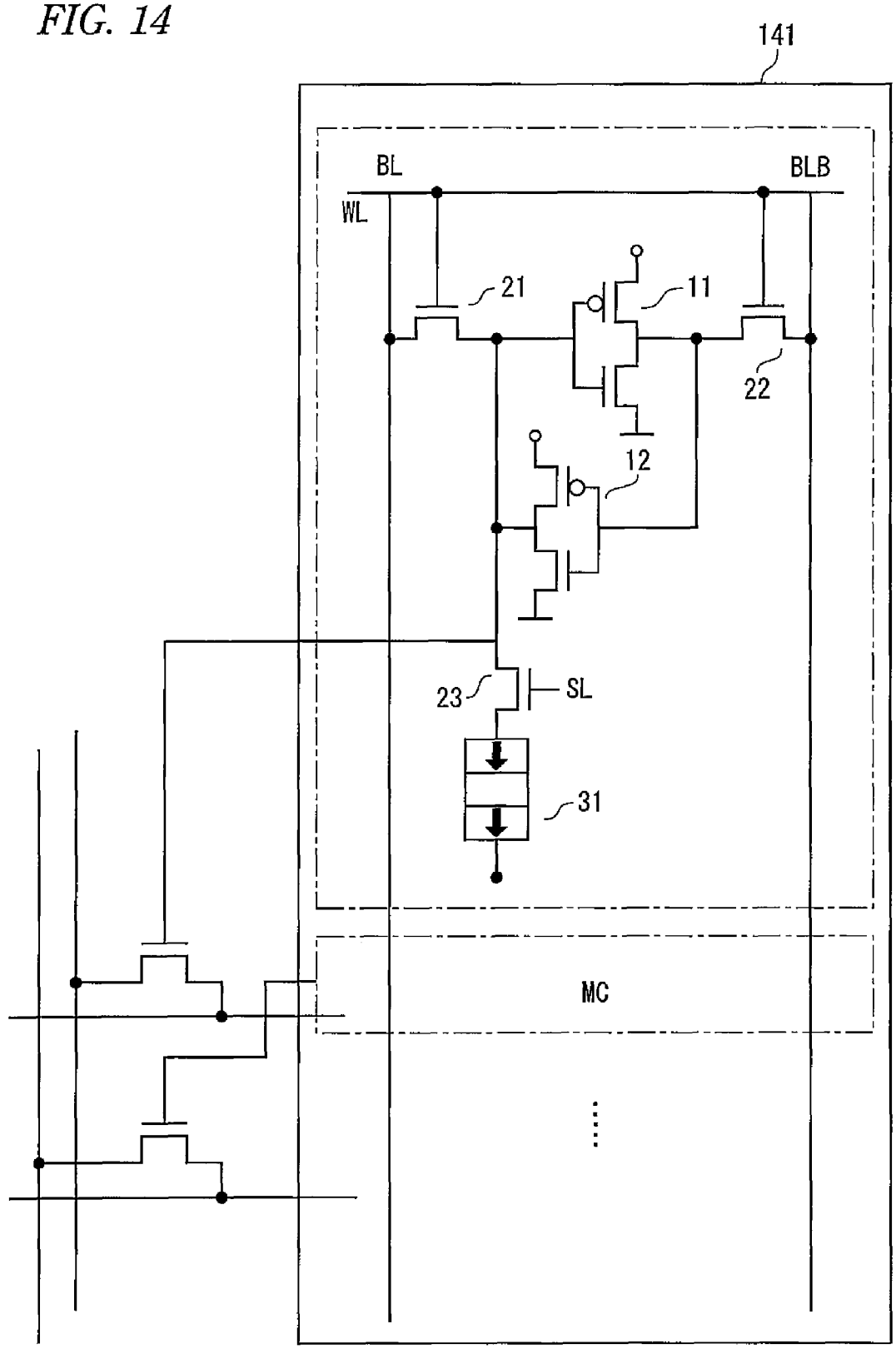
FIG. 14 shows another FPGA according to the third embodiment of the invention which employs the nonvolatile SRAM cell according to the first embodiment.

FIG. 14 shows a second example FPGA which employs the above-described nonvolatile SRAM cell 10 (MC) according to the first embodiment. In this FPGA, plural nonvolatile SRAM cells MC are arranged so as to form a memory cell array 141. In this example, data stored in the nonvolatile SRAM cells MC is used as data for control of transistors of a switching block of the FPGA.

While certain embodiments have been described, these embodiments have been presented by way of example only, and are not intended to limit the scope of the invention. Indeed, the novel methods and systems described herein may be embodied in a variety of other forms. Furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

What is claimed is:

1. A semiconductor integrated circuit comprising:
a first inverter comprising a first input terminal and a first output terminal;
a second inverter comprising a second input terminal and a second output terminal, wherein the second input terminal of the second inverter is connected to the first output terminal of the first inverter, and the second output terminal of the second inverter is connected to the first input terminal of the first inverter;
a first transistor, wherein a first end of the first transistor is connected to a first bit line and a second end of the first transistor is connected to the first input terminal of the first inverter;
a first element group comprising a plurality of second transistors, wherein a first end of the first element group is connected to the first output terminal of the first inverter and a second end of the first element group is connected to a second bit line; and
a second element group comprising a plurality of third transistors and a magnetoresistive element whose magnetic resistance is varied, wherein a first end of the second element group is connected to one of the first input terminal of the first inverter and the second input terminal of the second inverter, a second end of the second element group is connected to a ground line, and a given potential is applied to the second element group according to an operation, and
wherein a sum of a resistance value of the magnetoresistive element and on-resistance values of the third transistors is smaller than an on-resistance value of the first element group, if the magnetoresistive element is in a small-resistance state,
wherein the sum of the resistance value of the magnetoresistive element and the on-resistance values of the third transistors is larger than the on-resistance value of the first element group, if the magnetoresistive element is in a large-resistance state, and
wherein no magnetoresistive element is connected to the other of the first input terminal of the first inverter and the second input terminal of the second inverter.

2. The circuit of claim 1, further comprising:
a control circuit configured to ground the second bit line and the first terminal and to turn on the second transistors of the first element group and the third transistors disposed between the second output terminal of the second inverter and the first terminal, when the semiconductor integrated circuit is powered on.

3. The circuit of claim 2, wherein the control circuit allows a write current to flow through the magnetoresistive element by applying half of a reference voltage to the first terminal and turning on the third transistors before the semiconductor integrated circuit is powered off.

4. A processor wherein memory cell array comprising a plurality of the semiconductor integrated circuits of claim 1 is used as a cache.

5. The circuit of claim 1, wherein the second element group is disposed between the second output terminal of the second inverter and the first terminal.

6. The circuit of claim 1, wherein the second element group is disposed between the first transistor and the first terminal.

7. A semiconductor integrated circuit comprising:
a first inverter comprising a first input terminal and a first output terminal;
a second inverter comprising a second input terminal and a second output terminal, wherein the second input terminal of the second inverter is connected to the first output terminal of the first inverter, and the second output terminal of the second inverter is connected to the first input terminal of the first inverter;
a first transistor, wherein a gate of the first transistor is connected to a word line, a first end of the first transistor is connected to a first bit line, and a second end of the first transistor is connected to the first input terminal of the first inverter;

a second transistor, wherein a gate of the second transistor is connected to the word line, and a first end of the second transistor is connected to the first output terminal of the first inverter;

a third transistor, wherein a first end of the third transistor is connected to the first input terminal of the first inverter;

a magnetoresistive element whose magnetic resistance is varied and a first end of which is connected to a second end of the third transistor;

a fourth transistor connected in series with the second transistor, wherein a first end of the fourth transistor is connected to a second end of the second transistor, and a second end of the fourth transistor is connected to a second bit line; and a fifth transistor, wherein a first end of the fifth transistor is connected to a second end of the magnetoresistive element, and a second end of the fifth transistor is connected to a first terminal, wherein a given potential is applied to the first terminal according to an operation, wherein a sum of a resistance value of the magnetoresistive element and on-resistance values of the third transistor and the fifth transistor is smaller than a sum of on-resistance values of the second transistor and the fourth transistor, if the magnetoresistive element is in a small-resistance state, and wherein the sum of the resistance value of the magnetoresistive element and the on-resistance values of the third transistor and the fifth transistor is larger than the sum of the on-resistance values of the second transistor and the fourth transistor, if the magnetoresistive element is in a large-resistance state.

8. The circuit of claim 7, wherein the magnetoresistive element comprises:

a magnetization fixed layer connected to the third transistor;

a magnetization free layer connected to the fifth transistor; and a non-magnetic layer disposed between the magnetization fixed layer and the magnetization free layer.

9. A semiconductor integrated circuit comprising:

a first inverter comprising a first input terminal and a first output terminal;

a second inverter comprising a second input terminal and a second output terminal, wherein the second input terminal of the second inverter is connected to the first output terminal of the first inverter, and the second output terminal of the second inverter is connected to the first input terminal of the first inverter;

a first transistor, wherein a gate of the first transistor is connected to a word line, a first end of the first transistor is connected to a first bit line, and a second end of the first transistor is connected to the first input terminal of the first inverter;

a second transistor, wherein a gate of the second transistor is connected to the word line, a first end of the second transistor is connected to the first output terminal of the first inverter;

a third transistor, wherein a first end of the third transistor is connected to the first bit line;

a magnetoresistive element whose magnetic resistance is varied and a first end of which is connected to a second end of the third transistor;

a fourth transistor, wherein a first end of the fourth transistor is connected to a second end of the second transistor, and a second end of the fourth transistor is connected to a second bit line; and a fifth transistor, wherein a first end of the fifth transistor is connected to a second end of the magnetoresistive element, and a second end of the fifth transistor is connected to a first terminal, wherein a given potential is applied to the first terminal according to an operation, wherein a sum of a resistance value of the magnetoresistive element and on-resistance values of the first transistor, the third transistor, and the fifth transistor is smaller than a sum of on-resistance values of the second transistor and the fourth transistor if the magnetoresistive element is in a small-resistance state, and wherein the sum of the resistance value of the magnetoresistive element and the on-resistance values of the first transistor, the third transistor, and the fifth transistor is larger than the sum of the on-resistance values of the second transistor and the fourth transistor, if the magnetoresistive element is in a large-resistance state.

10. The circuit of claim 9, wherein the magnetoresistive element comprises:

a magnetization fixed layer connected to the third transistor;

a magnetization free layer connected to the fifth transistor; and a non-magnetic layer disposed between the magnetization fixed layer and the magnetization free layer.

* * * * *